(12) United States Patent
Deng et al.

(10) Patent No.: US 10,999,055 B2
(45) Date of Patent: May 4, 2021

(54) SERDES SYSTEMS AND DIFFERENTIAL COMPARATORS

(71) Applicant: Shanghai Zhaoxin Semiconductor Co., Ltd., Shanghai (CN)

(72) Inventors: Yulin Deng, Shanghai (CN); Xinwen Ma, Shanghai (CN)

(73) Assignee: SHANGHAI ZHAOXIN SEMICONDUCTOR CO., LTD., Shanghai (CN)

( * ) Notice: Subject to any disclaimer, the term of this patent is extended or adjusted under 35 U.S.C. 154(b) by 0 days.

(21) Appl. No.: 16/820,882

(22) Filed: Mar. 17, 2020

(65) Prior Publication Data

US 2020/0336289 A1    Oct. 22, 2020

(30) Foreign Application Priority Data

Apr. 17, 2019  (CN) .......................... 201910307668.3

(51) Int. Cl.
| *H04L 7/04* | (2006.01) |
| *H03L 7/081* | (2006.01) |
| *H03M 9/00* | (2006.01) |
| *H04J 3/06* | (2006.01) |
| *H04L 7/033* | (2006.01) |

(52) U.S. Cl.
CPC .............. *H04L 7/04* (2013.01); *H03L 7/0814* (2013.01); *H03M 9/00* (2013.01); *H04J 3/0685* (2013.01); *H04L 7/0337* (2013.01)

(58) Field of Classification Search
CPC ....... H04L 7/04; H04L 7/0337; H03L 7/0814; H04J 3/0685; H03M 9/00
See application file for complete search history.

(56) References Cited

U.S. PATENT DOCUMENTS

| 2010/0066450 | A1* | 3/2010 | Palmer | ................ H04L 25/0278 |
| | | | | 330/261 |
| 2011/0194595 | A1* | 8/2011 | Shetty | .................... H04W 52/52 |
| | | | | 375/224 |
| 2012/0224656 | A1* | 9/2012 | Aoki | .................... H04L 25/0274 |
| | | | | 375/316 |
| 2019/0056760 | A1* | 2/2019 | Zhang | ............ H03K 19/018528 |

* cited by examiner

*Primary Examiner* — Dac V Ha
(74) *Attorney, Agent, or Firm* — McClure, Qualey & Rodack, LLP

(57) ABSTRACT

A SerDes system is provided. The SerDes system includes channel circuits, a PLL circuit, first and second buffers, and first and second capacitors. Each channel circuit is coupled to the first and second clock lines. The PLL circuit generates a first differential signal including first and second clock signals. The first buffer buffers the first clock signal. The second buffer and buffers the second clock signal. The first capacitor receives the buffered first clock signal and outputs a third clock signal to the first clock line. The second capacitor receives a buffered second clock signal and outputs a fourth clock signal to the second clock line. A swing of a second differential signal comprising the third clock signal and the fourth clock signal is smaller than a swing of the first differential signal.

20 Claims, 10 Drawing Sheets

SERDES SYSTEMS AND DIFFERENTIAL COMPARATORS

CROSS REFERENCE TO RELATED APPLICATIONS

This application claims priority of China Patent Application No. 201910307668.3, filed on Apr. 17, 2019, the entirety of which is incorporated by reference herein.

BACKGROUND OF THE INVENTION

Field of the Invention

The present invention relates to a SerDes system, in particular, to a differential comparator of a SerDes system.

Description of the Related Art

With development of electronic technology, it becomes more difficult to increase speed of the traditional parallel interfaces, and the faster serial interfaces are provide to replace the parallel interfaces, so the serializer/deserializer (SerDes) system which is originally used for optical fiber communication has become the mainstream for high-speed serial interfaces. The SerDes system is a time division multiplexing (TDM) and point-to-point (P2P) serial communication system. At the transmitting terminal, multiple low-speed parallel signals are converted into high-speed serial signals. After transmission in a channel, the high-speed serial signals are reconverted to low-speed parallel signals at the receiving terminal. The high-speed serial signals in the SerDes system are usually differential signals. The high-speed serial signals have the characteristics of low power consumption, strong anti-interference, and high speed.

In order to support the transmission of the above-mentioned high-speed serial signals, the above-mentioned channel requires be driven by an on-chip high-speed clock, that is, a high-speed clock distribution network needs to be established in the SerDes system.

BRIEF SUMMARY OF THE INVENTION

The present invention provides a serializer/deserializer (SerDes) system which converts clock signals having a large swing into clock signals having small swing and then restores the clock signals having the small swing to clock signals having a large swing in each channel circuit.

An exemplary embodiment of a serializer/deserializer (SerDes) system is provided. The SerDes system comprises a plurality of channel circuits, a phase-locked loop circuit, a first buffer, a second buffer, a first capacitor, and a second capacitor. Each channel circuit is coupled to a first clock line and a second clock line. The phase-locked loop circuit generates a first differential signal which comprises a first clock signal and a second clock signal. The first buffer is coupled to the phase-locked loop circuit. The first buffer receives the first clock signal and buffers the first clock signal. The second buffer is coupled to the phase-locked loop. The second buffer receives the second clock signal and buffers the second clock signal. One terminal of the first capacitor is coupled to an output terminal of the first buffer to receive a buffered first clock signal, and the other terminal thereof is coupled to the first clock line to output a third clock signal. One terminal of the second capacitor is coupled to an output terminal of the second buffer to receive a buffered second clock signal, and the other terminal thereof is coupled to the second clock line to output a fourth clock signal. A swing of a second differential signal comprising the third clock signal and the fourth clock signal is smaller than a swing of the first differential signal.

An exemplary embodiment of a differential comparator for a serializer/deserializer (SerDes) system is provided. The differential comparator comprises a first-stage comparison circuit, a second-stage comparison circuit, and an inverter circuit. The first-stage comparison circuit comprising a first active inductor circuit receives a first differential signal comprising a first input voltage signal and a second input voltage signal respectively from a first clock line and a second clock line and generates a first comparison signal and a second comparison signal according to the first input voltage signal and the second input voltage signal. The second-stage comparison circuit is coupled to the first-stage comparison circuit. The second-stage comparison circuit receives the first comparison signal and the second comparison signal and generates a third comparison signal and a fourth comparison signal according to the first comparison signal and the second comparison signal. The inverter circuit is coupled to the second-stage comparison circuit. The inverter circuit receives the third comparison signal and the fourth comparison signal and respectively generates a second differential signal comprising a first output voltage signal and a second output voltage signal according to the third comparison signal and the fourth comparison signal. A swing of the second differential signal is larger than a swing of the first differential signal.

A detailed description is given in the following embodiments with reference to the accompanying drawings.

BRIEF DESCRIPTION OF THE DRAWINGS

The invention can be more fully understood by reading the subsequent detailed description and examples with references made to the accompanying drawings, wherein.

DETAILED DESCRIPTION OF THE INVENTION

The following description is of the best-contemplated mode of carrying out the invention. This description is made for the purpose of illustrating the general principles of the invention and should not be taken in a limiting sense. The scope of the invention is best determined by reference to the appended claims.

Figure 1:
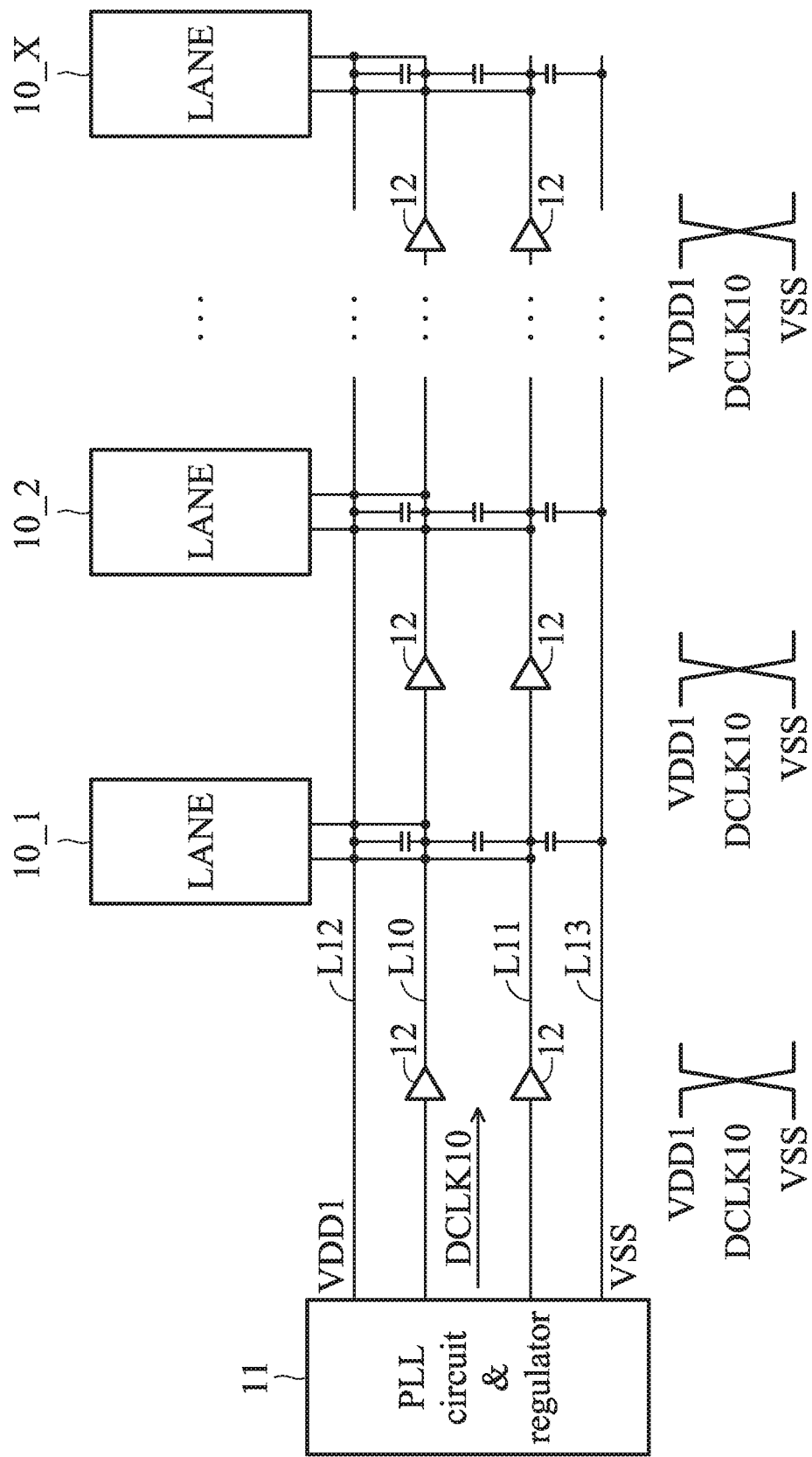
FIG. 1 shows an exemplary embodiment of a serializer/deserializer (SerDes) system.

FIG. 1 shows an exemplary embodiment of a serializer/deserializer (SerDes) system. In a SerDes system, in order to reduce area and power consumption, a phase-locked loop (PLL) circuit is generally shared by multiple channels (LANEs). As shown in FIG. 1, a plurality of channels 10_1 to 10_X share one PLL circuit 11. The PLL circuit 11 generates and outputs a pair of differential clock signals DCLK10, and transmits the pair of differential clock signals DCLK10 to the plurality of channels 10_1~10_X through a pair of clock lines L10 and L11. Considering that the large parasitic resistance and capacitance of the clock distribution network may limit the bandwidth of the clock distribution network, it is necessary to configure relay buffers 12 of multi-stages to drive the clock lines L10 and L11, herein the clock distribution network comprises the clock lines L10 and L11 and other elements for transmitting the pair of differential clock signals DCLK1 to each of the plurality of channels 10_1~10_X. However, the configuration of the relay buffers 12 of the multi-stages causes a gradual accumulation of signal jitter caused by power supply noise and component noise and further causes a gradual accumulation of phase errors caused by component mismatch. In order to reduce the influence of the power supply noise, a power supply voltage VDD1 and an operation voltage VSS of the regulator in the PLL circuit 11 are used to supply power to the relay buffer 12 of each stage. As shown in FIG. 1, the transmission line L12 transmits the power supply voltage VDD1 to the relay buffer 12 of each stage, and the transmission line L13 transmits the operation voltage VSS to the relay buffer 12 of each stage, herein, the "transmission lines" may also be described as "wires" or "transmission wires" in other embodiments. Since the power supply voltage VDD1 and the ground voltage GND need to be transmitted to the relay buffer 12 of each stage, excessive circuit layout space is occupied by the lines transmitting the power supply voltage VDD1 and the ground voltage GND, herein the operation voltage VSS may be regarded as the ground voltage GND. In addition, in the configuration of FIG. 1, the clock signals having relatively large swings are transmitted on the clock lines L10 and L11, which consumes a large dynamic power. Moreover, the relay buffers 12 of the multi-stages themselves also causes signal delay, which results the data transmission in different channels is not synchronized.

Figure 2:
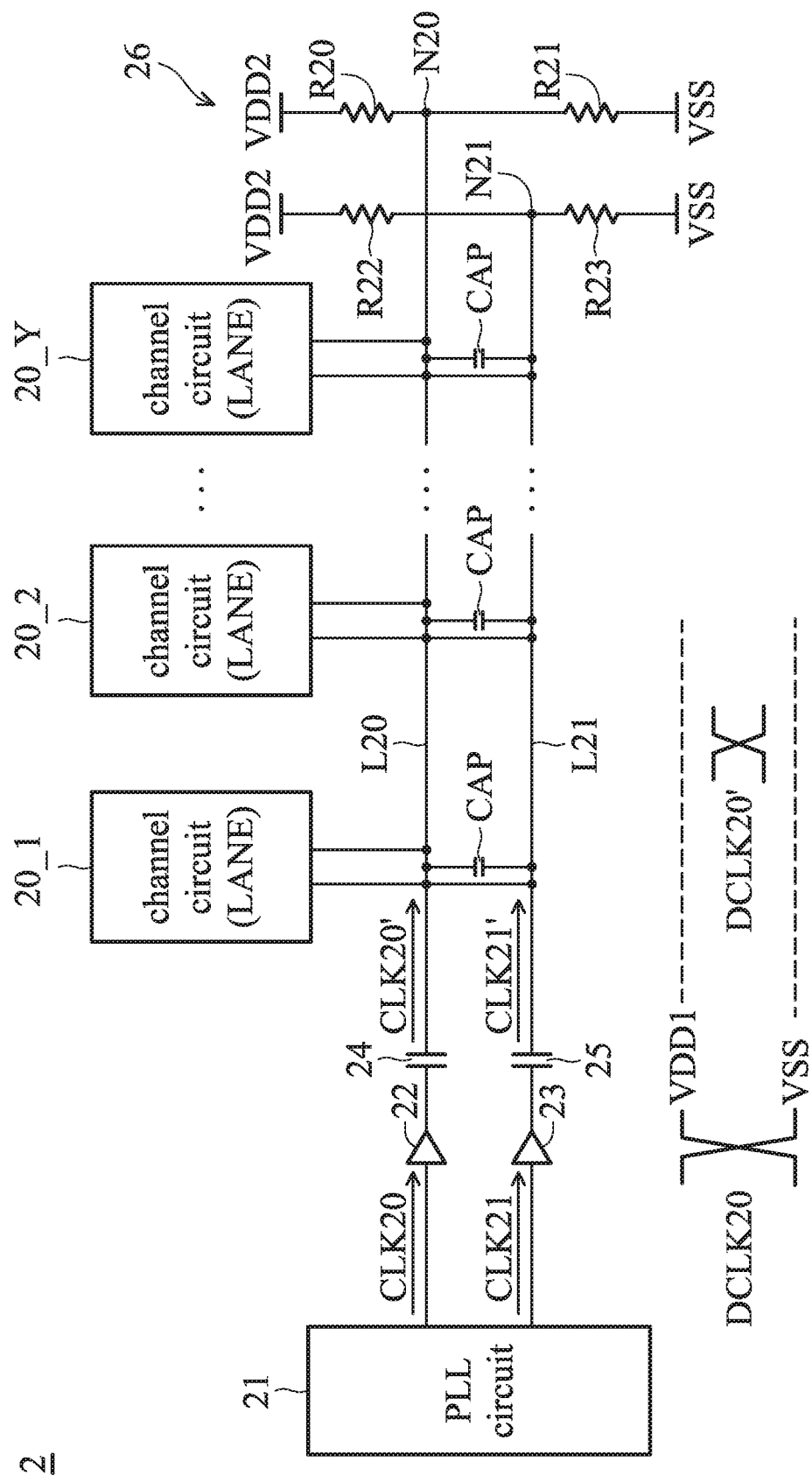
FIG. 2 shows another exemplary embodiment of a SerDes system.

FIG. 2 shows another exemplary embodiment of a SerDes system. Referring to FIG. 2, the SerDes system 2 comprises a plurality of channel circuits (LANE) 20_1~20_Y, a phase-locked loop (PLL) circuit 21, buffers 22~23, capacitors 24~25, and a terminal resistor circuit 26. In the embodiment, the capacitors 24 and 25 are metal-oxide-metal (MOM) capacitors. The PLL circuit 21 generates a pair of differential clock signals CLK20 and CLK21 having relatively large swings. The input terminal of the buffer 22 is coupled to the PLL circuit 21 to receive the clock signal CLK20 and buffer the clock signal CLK20. The input terminal of the buffer 23 is coupled to the PLL circuit 21 to receive the clock signal CLK21 and buffer the clock signal CLK21. The capacitor 24 is coupled between the output terminal of the buffer 22 and a clock line L20. The capacitor 25 is coupled between the output terminal of the buffer 23 and a clock line L21. The clock signal CLK20 transmitted to the clock line L20 through the buffer 22 and the capacitor 24 is converted into a clock signal CLK20' having a relatively small swing due to the voltage division achieved by the capacitor 24 and the parasitic capacitance CAP between the clock lines L20 and L21. The clock signal CLK21 transmitted to the clock line L21 through the buffer 23 and the capacitor 25 is converted into a clock signal CLK21' having a relatively small swing due to the voltage division achieved by the capacitor 25 and the parasitic capacitance CAP. As shown in FIG. 2, the differential signal DCLK20' formed by the clock signals CLK20' and CLK21' has a relatively small swing. The new small-swing differential signal DCLK20' formed by the clock signals CLK20' and CLK21' is transmitted to each of the channel circuits 20_1~20_Y through the clock lines L20 and L21.

The terminal resistor circuit 26 comprises resistors R20~R23. As shown in FIG. 2, one terminal of the resistor R20 receives an operation voltage VDD2, and the other terminal thereof is coupled to a node N20. One terminal of the resistor R21 is coupled to the node N20, and the other terminal thereof receives the operation voltage VSS. The operation voltage VSS is a voltage lower than the operation voltage VDD2, such as a ground voltage or a 0V voltage. In the embodiment, the operation voltage VSS is the ground voltage GND as an example. The end of the clock line L20 is coupled to the node N20. One terminal of the resistor R22 is coupled to the operation voltage VDD2, and the other terminal thereof is coupled to a node N21. One terminal of the resistor R23 is coupled to the node N21, and the other terminal thereof receives the operation voltage VSS. The end of the clock line L21 is coupled to the node N21. The terminal resistor circuit 26 is mainly used to provide an appropriate common-mode voltage for the differential signal DCLK20'. Because the resistances of the resistors R20~R23 is much larger than the output impedance of the buffers 22~23, so the effect of the terminal resistor circuit 26 on the swing of the differential signal DCLK20' can be ignored.

According to the embodiment of FIG. 2, the SerDes system 2 provided in the present invention comprises only the buffers 22 and 23 of one stage, so that the signal jitter caused by the power supply noise and the component noise is not increased by the accumulation. Further, there is no additional voltage regulator disposed in the PLL circuit 21, so that the area of the PLL circuit 21 is reduced, and the PLL circuit 21 is more easily implemented. As described above, transmitting the differential signal DCLK20' having the relatively small swing on the clock lines L20 and L21 may reduce the power consumption caused by the signal transmission.

Figure 3:
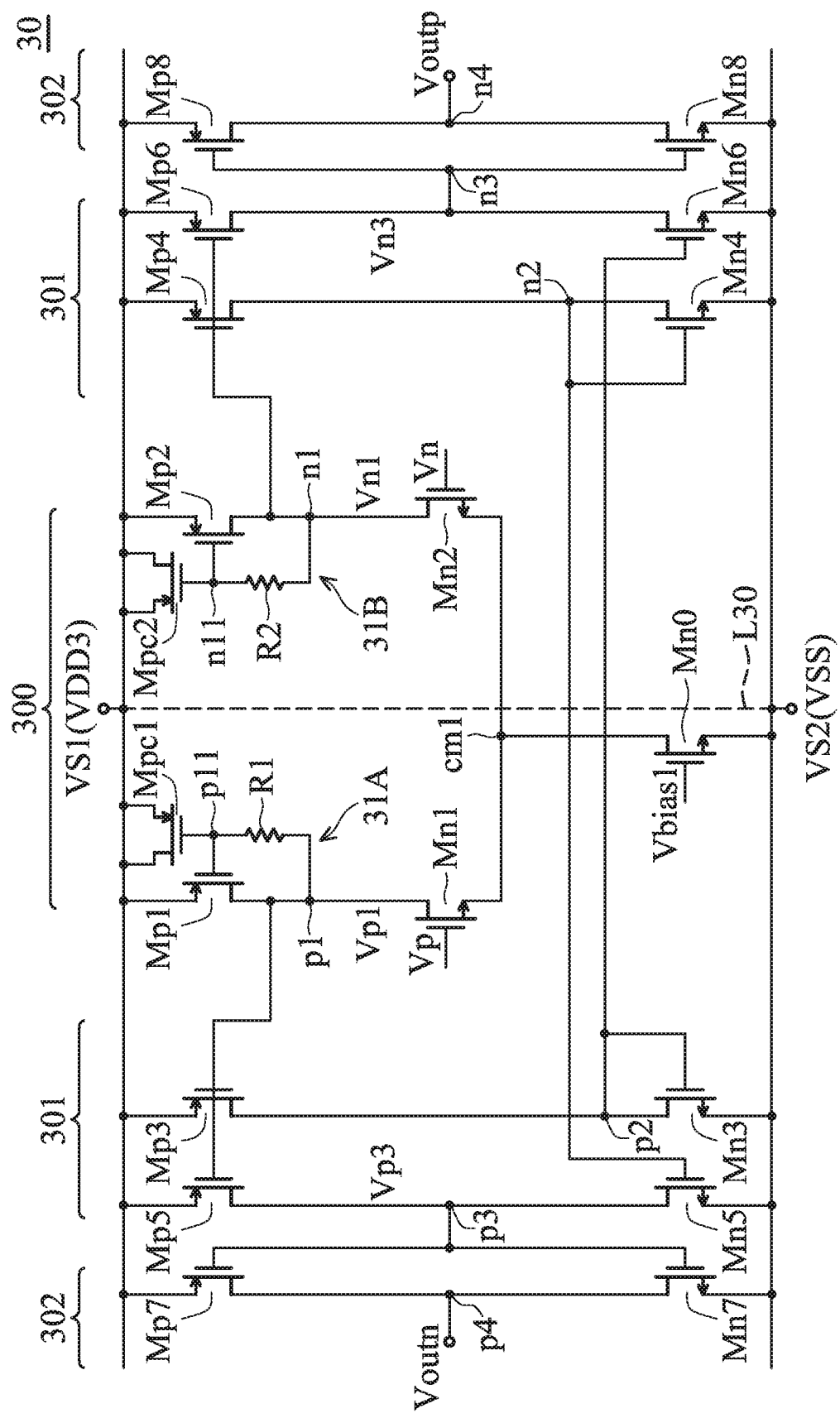
FIG. 3 shows an exemplary embodiment of a differential comparator.

According to an embodiment of the invention, the differential signal DCLK20' having the relatively small swing needs to be restored to a differential clock signal having a relatively large swing in each of the channel circuits 20_1~20_Y, and thus, each of the channel circuits 20_1~20_Y needs to comprise a differential comparator, such as a differential comparator 30 shown in FIG. 3. The differential comparator 30 of each of the channel circuits 20_1~20_Y is coupled to the clock lines L20 and L21 to receive the differential signal DCLK20' of the clock lines L20 and L21 as a pair of input differential signals. In detail, the differential comparator 30 receives the clock signal CLK20' as the voltage signal Vp of the input differential signal and receives the clock signal CLK21' as the other voltage signal Vn of the input differential signal, and further generates output voltage signals Voutp and Voutn with relatively large swings, The swings of the output voltage signals Voutp and Voutn having the relatively large swing are greater than the swing of the differential clock signal CLK20'. According to an embodiment of the invention, the swings of the output voltage signals Voutp and Voutn are equal to the swing of the differential clock signal CLK20. According to another embodiment of the present invention, the swings of the output voltage signals Voutp and Voutn are different from the swing of the differential clock signal CLK20. According to an embodiment of the invention, the power supply voltage VDD1 may be the same as the operation voltage VDD2. According to an embodiment of the invention, the power supply voltage VDD1 may be different from the operation voltage VDD2.

Referring to FIG. 3, the differential comparator 30 comprises comparison circuits of two stages and an inverter circuit 302. The comparison circuits of the two stages comprise a first-stage comparison circuit 300 and a second-stage comparison circuit 301. The first-stage comparison circuit 300 comprises P-type transistors Mp1, Mp2, Mpc1, and Mpc2, N-type transistors Mn1, Mn2, and Mn0, and resistors R1 and R2. In the embodiment of FIG. 3 and the subsequent embodiments, the components "transistor" are implemented by metal oxide-semiconductor (MOS) transistors or referred to as MOS, and, however, other embodiments are not limited thereto. The drain of the N-type transistor Mn1 is coupled to a node p1, the source of the N-type transistor Mn1 is coupled to a common-mode node cm1, and the gate of the N-type transistor Mn1 receives the input voltage signal Vp. The drain of the N-type transistor Mn2 is coupled to a node n1, the source of the N-type transistor Mn2 is coupled to the common-mode node cm1, and the gate of the N-type transistor Mn2 receives the input voltage signal Vn. The drain of the P-type transistor Mp1 is coupled to the node p1, the source of the P-type transistor Mp1 is coupled to a voltage source VS1, and the gate of the P-type transistor Mp1 is coupled to a node p11. In this embodiment, the voltage source VS1 provides an operation voltage VDD3, and a voltage source VS2 provides the operation voltage VSS. The drain and the source of the P-type transistor Mpc1 are coupled to the voltage source VS1, and the gate of the P-type transistor Mpc1 is coupled to the node p11. The P-type transistor Mpc1 forms a capacitor. The resistor R1 is coupled between the nodes p11 and p1. The P-type transistor Mp1, the P-type transistor Mpc1, and the resistor R1 constitute an active inductor 31A. The drain of the P-type transistor Mp2 is coupled to the node n1, the source of the P-type transistor Mp2 is coupled to the voltage source VS1, and the gate of the P-type transistor Mp2 is coupled to a node n11. The drain and source of the P-type transistor Mpc2 are coupled to the voltage source VS1, and the gate of the P-type transistor Mpc2 is coupled to the node n11. The P-type transistor Mpc2 forms a capacitor. The resistor R2 is coupled between the nodes n11 and n1. The P-type transistor Mp2, the P-type transistor Mpc2, and the resistor R2 constitute an active inductor 31B. The active inductors 31A and 31B form an active inductor circuit. The drain of the N-type transistor Mn0 is coupled to the common-mode node cm1, the source of the N-type transistor Mn0 is coupled to the voltage source VS2, and the gate of the N-type transistor Mn0 receives a bias voltage Vbias1. The N-type transistor Mn0 operates as a current source. The first-stage comparison circuit 300 operates according to the received voltage signals Vp and Vn to generate a comparison signal Vp1 and a comparison signal Vn1 respectively on the node p1 and the node n1. In an embodiment of the invention, the operation voltage VDD3 is the same as the supply voltage VDD1 described above. In another embodiment of the invention, the operation voltage VDD3 is different from the power supply voltage VDD1.

The second-stage comparison circuit 301 comprises P-type transistors Mp3~Mp6 and N-type transistors Mn3~Mn6. The drain of the P-type transistor Mp3 is coupled to a node p2, the source of the P-type transistor Mp3 is coupled to the voltage source VS1, and the gate of the P-type transistor Mp3 is coupled to the node p1 to receive the comparison signal Vp1. The drain of the N-type transistor Mn3 is coupled to the node p2, the source of the N-type transistor Mn3 is coupled to the voltage source VS2, and the gate of the N-type transistor Mn3 is coupled to the node p2. The drain of the P-type transistor Mp5 is coupled to a node p3, the source of the P-type transistor Mp5 is coupled to the voltage source VS1, and the gate of the P-type transistor Mp5 is coupled to the node p1 to receive the comparison signal Vp1. The drain of the N-type transistor Mn5 is coupled to the node p3, the source of the N-type transistor Mn5 is coupled to the voltage source VS2, and the gate of the N-type transistor Mn5 is coupled to the node n2. The drain of the P-type transistor Mp4 is coupled to a node n2, the source of the P-type transistor Mp4 is coupled to the voltage source VS1, and the gate of the P-type transistor Mp4 is coupled to the node n1 to receive the comparison signal Vn1. The drain of the N-type transistor Mn4 is coupled to the node n2, the source of the N-type transistor Mn4 is coupled to the voltage source VS2, and the gate of the N-type transistor Mn4 is coupled to the node n2. The drain of the P-type transistor Mp6 is coupled to a node n3, the source of the P-type transistor Mp6 is coupled to the voltage source VS1, and the gate of the P-type transistor Mp6 is coupled to the node n1 to receive the comparison signal Vn1. The drain of the N-type transistor Mn6 is coupled to the node n3, the source of the N-type transistor Mn6 is coupled to the voltage source VS2, and the gate of the N-type transistor Mn6 is coupled to the node p2. The second-stage comparison circuit 301 operates according to the received comparison signals Vp1 and Vn1 to generate a comparison signal Vp3 and a comparison signal Vn3 respectively on the node p3 and the node n3.

The inverter circuit 302 comprises P-type transistors Mp7~Mp8 and N-type transistors Mn7~Mn8. The drain of the P-type transistor Mp7 is coupled to a node p4, the source of the P-type transistor Mp7 is coupled to the voltage source VS1, and the gate of the P-type transistor Mp7 is coupled to the node p3 to receive the comparison signal Vp3. The drain of the N-type transistor Mn7 is coupled to the node p4, the source of the N-type transistor Mn7 is coupled to the voltage source VS2, and the gate of the N-type transistor Mn7 is coupled to the node p3 to receive the comparison signal Vp3. The transistors Mp7 and Mn7 constitute an inverter which inverts the received comparison signal Vp3 to generate the output voltage signal Voutp. The drain of the P-type transistor Mp8 is coupled to a node n4, the source of the P-type transistor Mp8 is coupled to the voltage source VS1, and the gate of the P-type transistor Mp8 is coupled to the node n3 to receive the comparison signal Vn3. The drain of the N-type transistor Mn8 is coupled to the node n4, the source of the N-type transistor Mn8 is coupled to the voltage source VS2, and the gate of the N-type transistor Mn8 is coupled to the node n3 to receive the comparison signal Vn3. The transistors Mp8 and Mn8 constitute another inverter which inverts the received comparison signal Vn3 to generate the output voltage signal Voutn. The output voltage signals Voutp and Voutn are a pair of differential signals that may serve as a pair of differential clock signals for components or devices within the corresponding channel circuit.

Further, in the differential comparator 30, elements which are symmetrically disposed on the two sides of the symmetry axis represented by the dotted line L30 have the same size. For example, the P-type transistors Mpc1 and Mpc2 are axial symmetrical with respect to the dotted line L30 and have the same size, the P-type transistors Mp1 and Mp2 are axial symmetrical with respect to the dotted line L30 and have the same size, and the N-type transistors Mn1 and Mn2 are axial symmetrical with respect to the dotted line L30 and have the same size, the P-type transistors Mp3 and Mp4 are axial symmetrical with respect to the dotted line L30 and have the same size, and the like. Further, the signals on the nodes which are axial symmetrically disposed with respect to the dotted line L30 form pairs of differential signals. For example, the comparison signal Vp1 on the node p1 and the comparison signal Vn1 on the node n1 form a pair of differential signals, and the comparison signal Vp3 on the node p3 and the comparison signal Vn3 on the node n3 form another pair of differential signals. Therefore, the circuit on the left side of the dotted line L30 and the circuit on the right side of the dotted line L30 have the same zero(s) and the same pole(s) in the frequency response. The zero(s) and the pole(s) will be analyzed by taking the circuit on the left side of the dotted line L30 as an example. It should be noted that since the inverter circuit 302 is used to increase the driving capability of the differential comparator 30, the analysis about the zero(s) and/or pole(s) in this embodiment will not involve the inverter circuit 302.

The output impedance Z1 of the first-stage comparison circuit 300 (that is, the equivalent impedance of the node p1) is:

$$Z1 = \frac{1 + sR_1 C_{p11}}{g_{mp1} + sC_{p11}} \quad (1)$$

Herein, $g_{mp1}$ represents the transconductance of the P-type transistor Mp1 of the active inductor 31A, $R_1$ represents the resistance value of the resistor R1 of the active inductor 31A, and $C_{p11}$ represents the total capacitance of the node p11.

The output impedance Z2 of the second-stage comparison circuit 301 (that is, the equivalent impedance of the node p3) is:

$$Z2 = r_{dsn5} \| r_{dsp5} \quad (2)$$

Herein, $r_{dsn5}$ represents the drain-source resistance of the N-type transistor Mn5, and $r_{dsp5}$ represents the drain-source resistance of the P-type transistor Mp5.

In order to clearly illustrate the overall gain $A_v$ of the differential comparator 30, the effect of the equivalent impedance of the node p2 on the zero-pole analysis is ignored.

The overall gain $A_v$ of the differential comparator 30 is:

$$A_v(s) = \frac{A_v(0)\left(1 + \frac{S}{z_1}\right)}{\left(\frac{S}{p_1} - 1\right) * \left(\frac{S}{p_2} - 1\right) * \left(\frac{S}{p_3} - 1\right)} \quad (3)$$

Herein, $A_v(0)$ represents the direct-current (DC) gain of the differential comparator 30. Based on Equation (3), there are one zero $z_1$ and three poles $p_1$, $p_2$, $p_3$ in the frequency response. According to the Equation (1) and Equation (3), the pole $p_1$ is:

$$p1 = \frac{-(C1 + C_{p11}) + \sqrt{(C1 + C_{p11})^2 - 4 * gmp1 * R_1 * C1 * C_{p11}}}{2 * R_1 * C1 * C_{p11}} \quad (4)$$

According to Equation (2) and Equation (3), the pole $p_2$ is:

$$p2 = \frac{1}{(r_{dsn5} \| r_{dsp5})C_2} \quad (5)$$

Herein, $C_2$ represents the sum of the gate capacitances of the transistors Mp7 and Mn7 and the drain capacitances of the transistors Mp5 and Mn5.

According to Equation (1) and Equation (3), the pole $p_3$ is:

$$p3 = \frac{-(C1 + C_{p11}) - \sqrt{(C1 + C_{p11})^2 - 4 * gmp1 * R_1 * C1 * C_{p11}}}{2 * R_1 * C1 * C_{p11}} \quad (6)$$

According to Equation (1) and Equation (3), the zero $z_1$ induced by the active inductor 31A is:

$$Z_1 = \frac{1}{R_1 C_{p11}} \quad (7)$$

Figure 4:
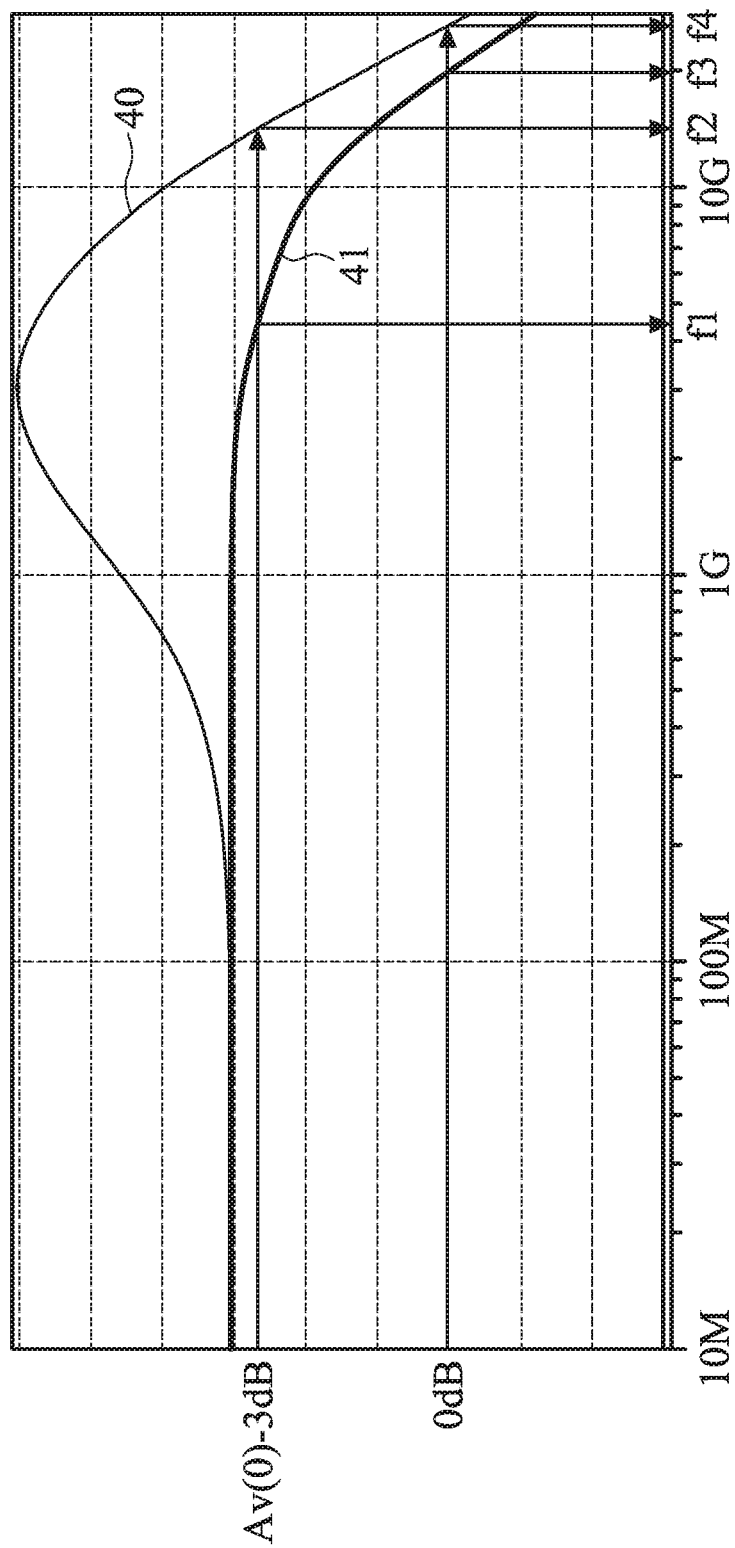
FIG. 4 shows a gain curve of a differential comparator according to an exemplary embodiment.

In FIG. 4, the curve 41 shows the variation of the gain of the differential comparator without the active inductors 31A and 31B shown in FIG. 3 as the variation of the input-signal frequency, the curve 40 shows the variation of the gain of the differential comparator 30 as the variation of the input-signal frequency. Herein the curves 40 and 41 are mainly used to illustrate the effect of active inductors 31A and 31B on increasing bandwidth but may not accurately reflect the overall gain of the comparator 30. As shown by the curve 41, for the differential comparator without the active inductors 31A and 31B, when the gain of the circuit is Av(0)-3 dB, the corresponding frequency is f1, that is, when the gain is reduced to 3 dB lower than the DC gain Av(0), the corresponding frequency is f1. When the gain of the circuit is 0 dB, the corresponding frequency is f3, that is, when the gain is reduced to 0 dB, the corresponding frequency is f3. Referring to the curve 40 of FIG. 4 and according to Equations (3) to Equation (7), for the differential comparator 30 shown in FIG. 3, due to the existence of the zero $z_1$, the gain of the differential comparison 30 is increased and then decreased after the zero $z_1$, herein the frequency corresponding to the gain of Av(0)-3 dB is increased to f2, and the frequency corresponding to 0 dB is increased to f4. Thus, through the active inductors 31A and 31B, the bandwidth of the differential comparator 30 may be increased, so that the differential comparator 30 may process a higher-frequency signal, for example, when the gain is Av(0)-3 dB, the differential comparator 30 may process a frequency f2 which is greater than 10 GHz. The increment of the bandwidth may shorten the time spent on the transition zone which is occurred when the internal signals generated by the differential comparator 30 are inverted and may further reduce the jitter caused by the power supply noise.

Figure 5:
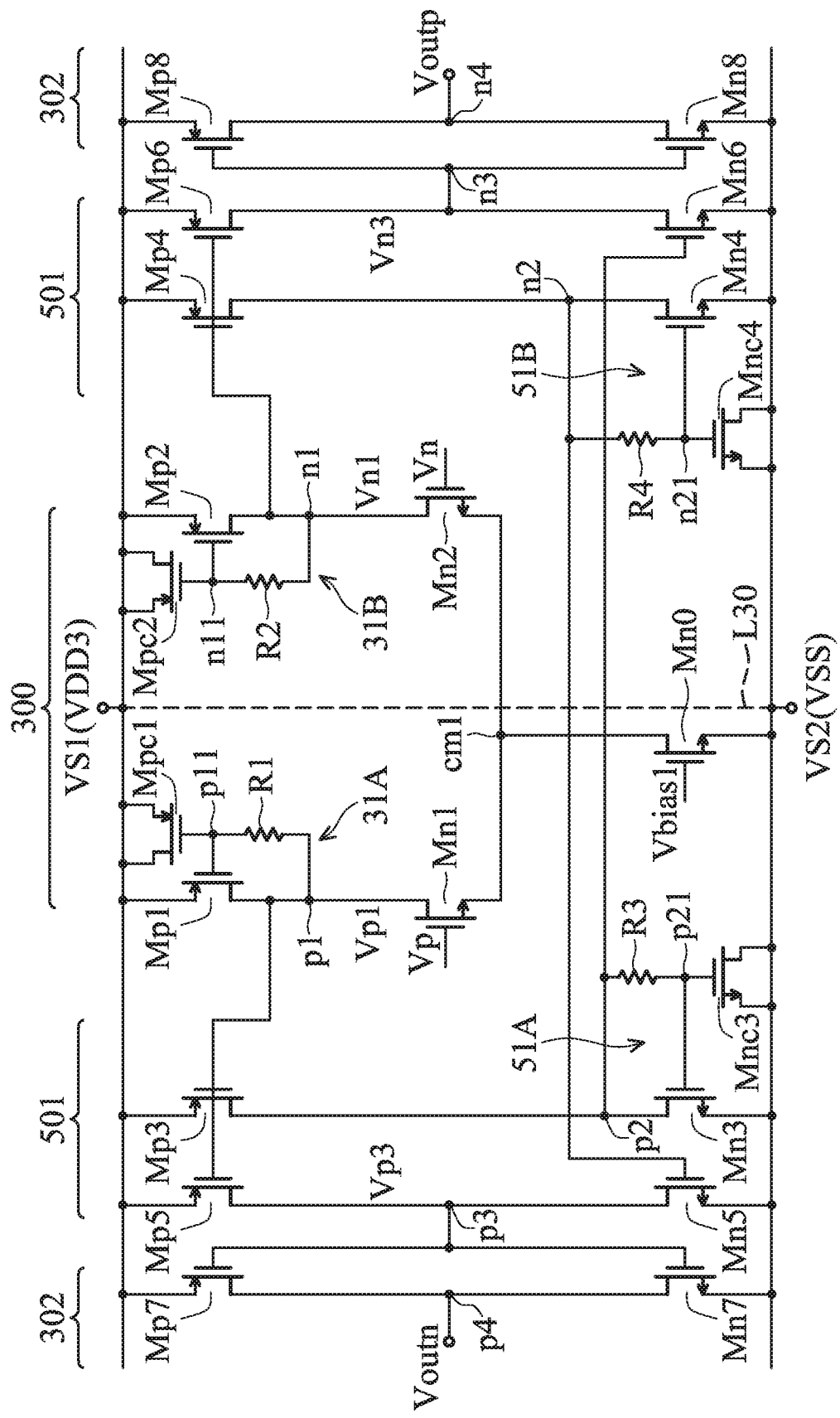
FIG. 5 shows another exemplary embodiment of a differential comparator.

In other embodiments, the second-stage comparison circuit may also comprise active inductor circuits to introduce other zeros, thereby further increasing the bandwidth, such as, the bandwidths corresponding to the aforementioned gains of Av(0)-3 dB and 0 dB gain. Referring to FIG. 5, the second-stage comparison circuit 301 of FIG. 3 is replaced by a second-stage comparison circuit 501. In addition to the aforementioned P-type transistors Mp3~Mp6 and N-type transistors Mn3~Mn6, the second-stage comparison circuit 501 further comprises N-type transistors Mnc3 and Mnc4 and resistors R3 and R4. The connection configurations of the P-type transistors Mp3~Mp6 and the N-type transistors Mn5 and Mn6 are the same as these shown in FIG. 3, and the related description thereof will be omitted. As shown in FIG. 5, the drain of the N-type transistor Mn3 is coupled to the node p2, the source of the N-type transistor Mn3 is coupled to the voltage source VS2, and the gate of the N-type transistor Mn3 is coupled to a node p21. The drain and source of the N-type transistor Mnc3 are coupled to the voltage source VS2, and the gate of the N-type transistor Mnc3 is coupled to the node p21. Herein the N-type transistor Mnc3 may be regarded as a capacitor. The resistor R3 is coupled between the nodes p21 and p2. The N-type transistor Mn3, the N-type transistor Mnc3, and the resistor R3 constitute an active inductor 51A. The drain of the N-type transistor Mn4 is coupled to the node n2, the source of the N-type transistor Mn4 is coupled to the voltage source VS2, and the gate of the N-type transistor Mn4 is coupled to a node n21. The drain and source of the N-type transistor Mnc4 are coupled to the voltage source VS2, and the gate of the N-type transistor Mnc4 is coupled to the node n21. Herein the N-type transistor Mnc4 may be regarded as a capacitor. The resistor R4 is coupled between the nodes n21 and n2. The N-type transistor Mn4, the N-type transistor Mnc4, and the resistor R4 constitute an active inductor 51B. The active inductors 51A and 51B constitute an active inductor circuit.

According to the embodiment of FIG. 5, since the second-stage comparison circuit 501 also comprises the active inductors 51A and 51B, another zeros are introduced in the frequency response related to the gain. Compared with the embodiment of FIG. 3, the bandwidth corresponding to the gain of Av(0)-3 dB is expanded to exceed the frequency f2, and the bandwidth corresponding to the gain of 0 dB is expanded to exceed the frequency f4, so that the differential comparison shown in the embodiment of FIG. 5 may process signals with higher frequency.

Figure 6:
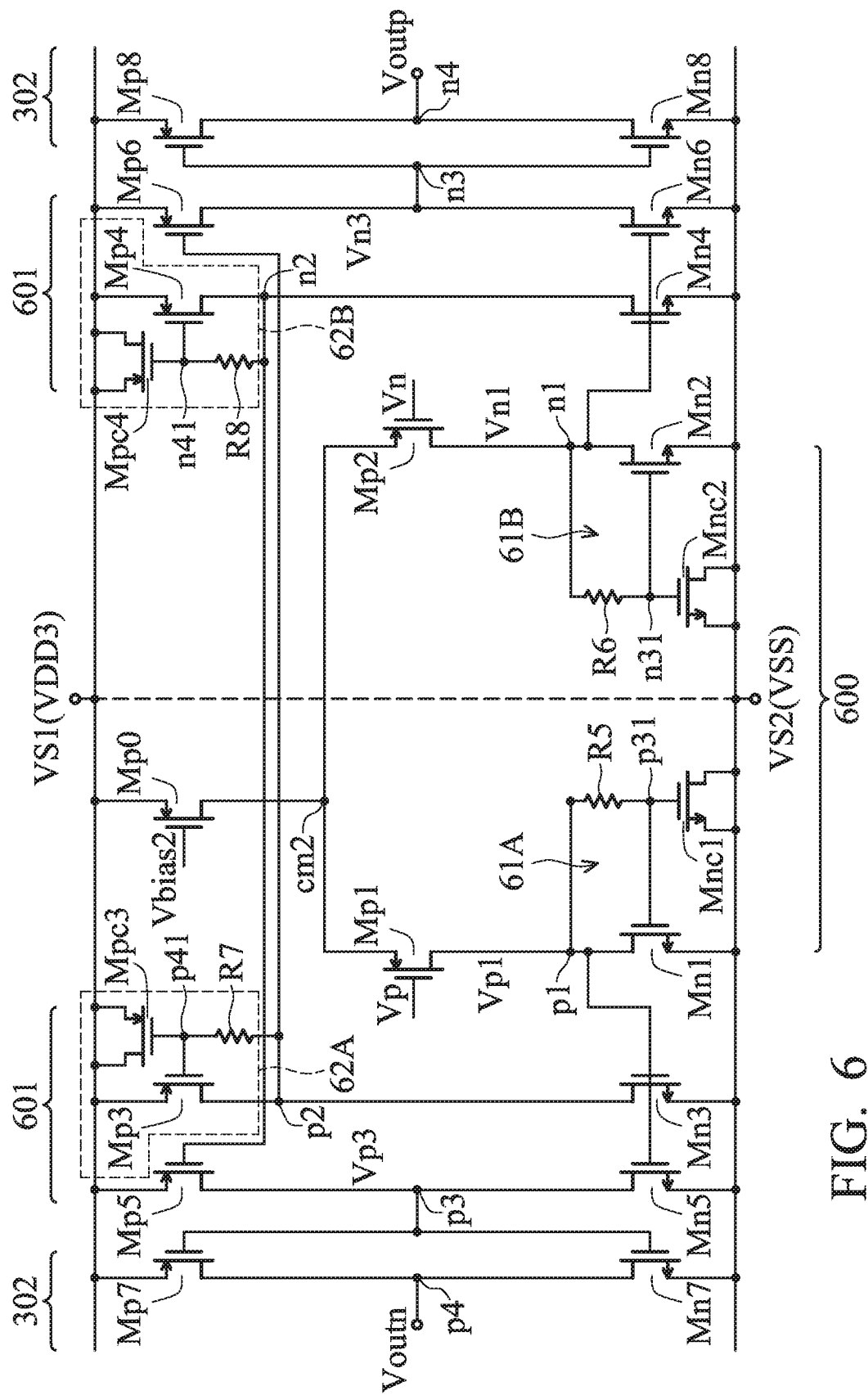
FIG. 6 shows another exemplary embodiment of a differential comparator.

FIG. 6 shows another exemplary embodiment of the differential comparator. Referring to FIG. 6, the differential comparator comprises a first-stage comparison circuit 600, a second-stage comparison circuit 601, and an inverter circuit 302. In addition to the aforementioned P-type transistors Mp1 and Mp2 and N-type transistors Mn1 and Mn2, the first-stage comparison circuit 600 further comprises a P-type transistor Mp0, N-type transistors Mnc1 and Mnc2, and resistors R5 and R6. The drain of the P-type transistor Mp1 is coupled to the node p1, the source of the P-type transistor Mp1 is coupled to a common-mode node cm2, and the gate of the P-type transistor Mp1 receives the voltage signal Vp. The drain of the P-type transistor Mp2 is coupled to the node n1, the source of the P-type transistor Mp2 is coupled to the common-mode node cm2, and the gate of the P-type transistor Mp2 receives the voltage signal Vn. The drain of the N-type transistor Mn1 is coupled to the node p1, the source of the N-type transistor Mn1 is coupled to the voltage source VS2, and the gate of the N-type transistor Mn1 is coupled to a node p31. The drain and the source of the N-type transistor Mnc1 are coupled to the voltage source VS2, and the gate of the N-type transistor Mnc1 is coupled to the node p31. Herein the N-type transistor Mnc1 may be regarded as a capacitor. The resistor R5 is coupled between the nodes p31 and p1. The N-type transistor Mn1, the N-type transistor Mnc1, and the resistor R5 constitute an active inductor 61A. The drain of the N-type transistor Mn2 is coupled to the node n1, the source of the N-type transistor Mn2 is coupled to the voltage source VS2, and the gate of the N-type transistor Mn2 is coupled to a node n31. The drain and source of the N-type transistor Mnc2 are coupled to the voltage source VS2, and the gate of the N-type transistor Mnc2 is coupled to the node n31. Herein the N-type transistor Mnc2 may be regarded as a capacitor. The resistor R6 is coupled between the nodes n31 and n1. The N-type transistor Mn2, the N-type transistor Mnc2, and the resistor R6 constitute an active inductor 61B. The active inductors 61A and 61B constitute an active inductor circuit. The drain of the P-type transistor Mp0 is coupled to the common-mode node cm2, the source of the P-type transistor Mp0 is coupled to the voltage source VS1, and the gate of the P-type transistor Mp0 receives a bias voltage Vbias2. Herein the P-type transistor Mp0 serves as a current source. The first-stage comparison circuit 600 operates according to the received voltage signals Vp and Vn to generate comparison signals Vp1 and Vn1 respectively on the nodes p1 and n1.

In addition to the aforementioned P-type transistors Mp3~Mp6 and N-type transistors Mn3~Mn6, the second-stage comparison circuit 601 further comprises P-type transistors Mpc3 and Mpc4 and resistors R7 and R8. Referring to FIG. 6, the drain of the P-type transistor Mp3 is coupled to the node p2, the source of the P-type transistor Mp3 is coupled to the voltage source VS1, and the gate of the P-type transistor Mp3 is coupled to a node p41. The drain and the source of the P-type transistor Mpc3 are coupled to the voltage source VS1, and the gate of the P-type transistor Mpc3 is coupled to the node p41. Herein the P-type transistor Mpc3 may be regarded as a capacitor. The resistor R7 is coupled between the nodes p41 and p2. The P-type transistor Mp3, the P-type transistor Mpc3, and the resistor R7 constitute an active inductor 62A. The drain of the N-type transistor Mn3 is coupled to the node p2. The source of the N-type transistor Mn3 is coupled to the voltage source VS2, and the gate of the N-type transistor Mn3 is coupled to the node p1 to receive the comparison signal Vp1. The drain of the P-type transistor Mp5 is coupled to the node p3, the source of the P-type transistor Mp5 is coupled to the voltage source VS1, and the gate of the P-type transistor Mp5 is coupled to the node n2. The drain of the N-type transistor Mn5 is coupled to the node p3. The source of the N-type transistor Mn5 is coupled to the voltage source VS2, and the gate of the N-type transistor Mn5 is coupled to the node p1 to receive the comparison signal Vp1. The drain of the P-type transistor Mp4 is coupled to the node n2, the source of the P-type transistor Mp4 is coupled to the voltage source VS1, and the gate of the P-type transistor Mp4 is coupled to the node n41. The drain and source of the P-type transistor Mpc4 are coupled to the voltage source VS1, and the gate of the P-type transistor Mpc4 is coupled to the node n41. Herein the P-type transistor Mpc4 may be regarded as a capacitor. The resistor R8 is coupled between the nodes n41 and n2. The P-type transistor Mp4, the P-type transistor Mpc4, and the resistor R8 constitute an active inductor 62B. The drain of the N-type transistor Mn4 is coupled to the node n2. The source of the N-type transistor Mn4 is coupled to the voltage source VS2, and the gate of the N-type transistor Mn4 is coupled to the node n1 to receive the comparison signal Vn1. The drain of the P-type transistor Mp6 is coupled to the node n3, the source of the P-type transistor Mp6 is coupled to the voltage source VS1, and the gate of the P-type transistor Mp6 is coupled to the node p2. The drain of the N-type transistor Mn6 is coupled to the node n3, the source of the N-type transistor Mn6 is coupled to the voltage source VS2, and the gate of the N-type transistor Mn6 is coupled to the node n1 to receive the comparison signal Vn1. The second-stage comparison circuit 601 operates according to the received comparison signals Vp1 and Vn1 to generate comparison signals Vp3 and Vn3 respectively on the nodes p3 and n3.

The circuit structure of the inverter circuit 302 in FIG. 6 is the same as that of the inverter circuit 302 shown in FIG. 3, the detailed description omitted here may refer to the related description of FIG. 3. According to the embodiment of FIG. 6, since the first-stage comparison circuit 600 and the second-stage comparison circuit 601 both comprise active inductors, zeros are introduced in the frequency response of the gain, so that the bandwidth is further expanded, herein the bandwidth corresponding to each fixed gain point, such as the bandwidth corresponding to the gain of Av(0)-3 dB or the gain of 0 dB, is further increased. Accordingly, the differential comparator shown in the embodiment of FIG. 6 may process signals with higher frequency.

Figure 7:
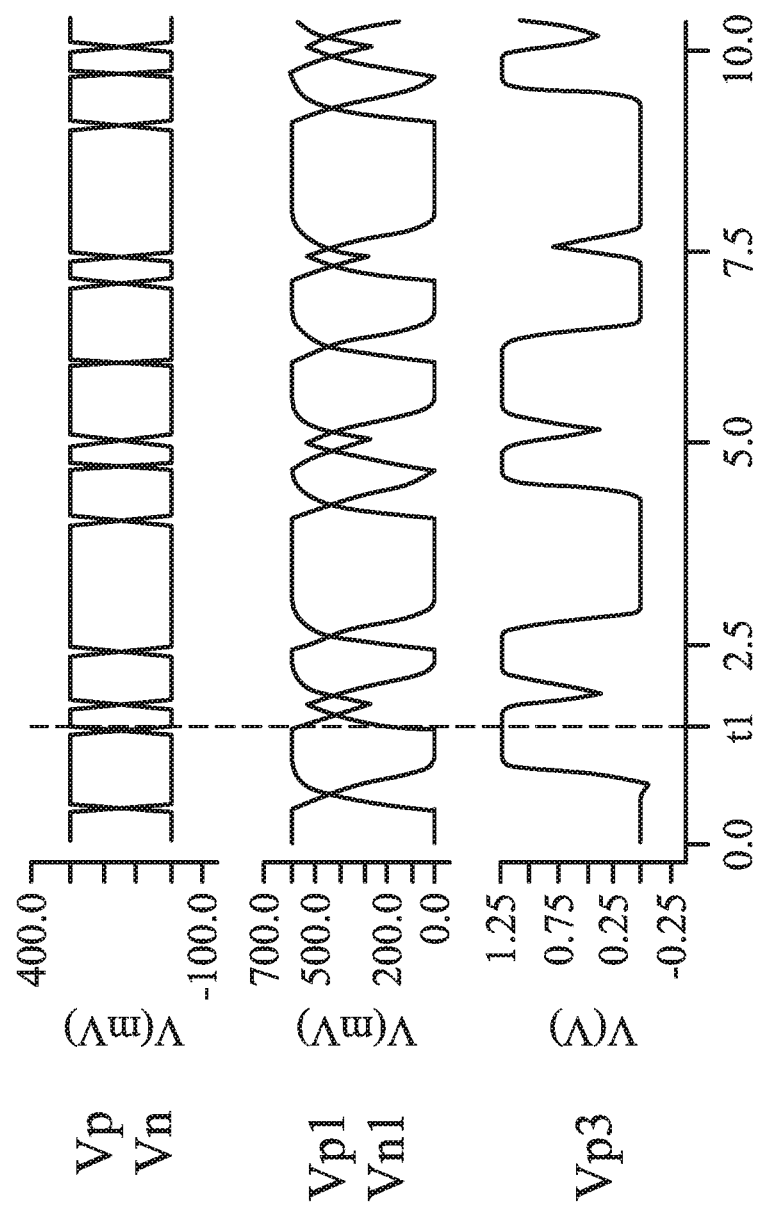
FIG. 7 shows a timing chart of main signals of a differential comparator according to an exemplary embodiment.

FIG. 7 is a timing chart showing the voltage signals Vp and Vn, the comparison signals Vp1 and Vn1, and the comparison signal Vp3. As shown in FIG. 7, the voltage signals Vp and Vn are switched between a high level and a low level according to the clock signals CLK20 and CLK21, respectively. Referring to FIGS. 6 and 7, when the voltage signals Vp and Vn remain unchanged, for example, when the voltage signal Vp is continuously at a low level and the voltage signal Vn is continuously at a high level, the comparison signal Vp1 or Vn1 is lowered to the low operation voltage, VSS, for example, a voltage of 0V, to completely turn off the N-type transistors Mn3 and Mn5 or the N-type transistors Mn4 and Mn6. When the voltage signals Vp and Vn are inverted, for example, at the time point t1, the comparison signal Vp1 or Vn1 starts to rise from the low operation voltage VSS. However, if the comparison signal Vp1 or Vn1 has not yet reached the steady state and the voltage signals Vp and Vn are inverted again, the comparison signal Vp3 and the comparison signal Vn3 (not shown) may not reach the high/low threshold voltage of the inverter, so that the differential comparison circuit may generate incorrect output voltage signals Voutp and Voutn, herein the comparison signal Vn3 may be regarded as the inverted signal of the comparison signal Vp3. Therefore, according to another embodiment of the present invention, a clamp circuit is added to the first-stage comparison circuit to avoid this problem.

Figure 8:
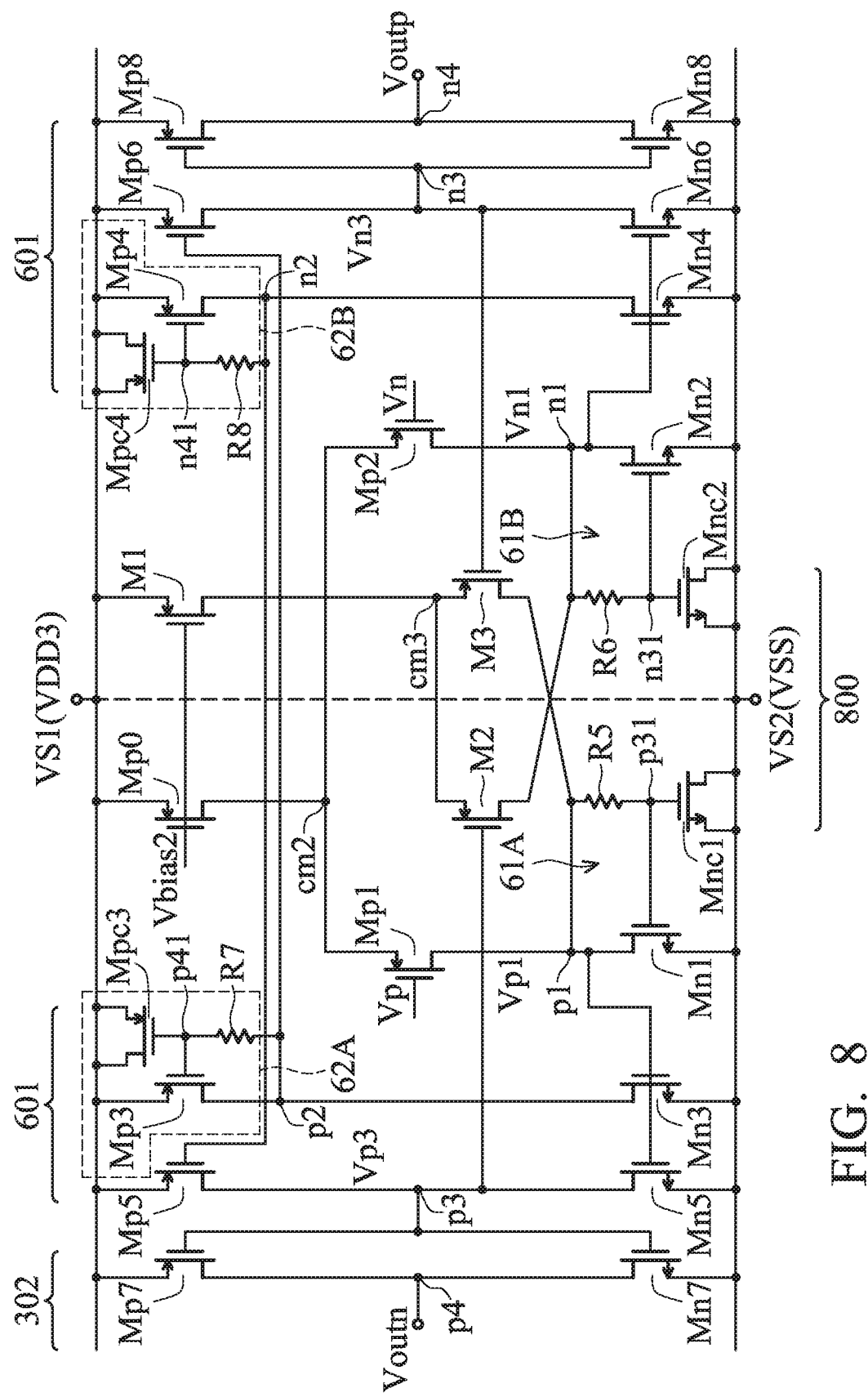
FIG. 8 shows another exemplary embodiment of a differential comparator.

Referring to FIG. 8, the first-stage comparison circuit 600 of FIG. 6 is replaced by a first-stage comparison circuit 800. In addition to the aforementioned P-type transistors Mp0~Mp2, and the aforementioned N-type transistors Mn1, Mn2, Mnc1, and Mnc2, and the aforementioned resistors R5 and R6, the first-stage comparison circuit 800 comprises P-type transistors M1~M3. The connection configures of the P-type transistors Mp0~Mp2, the N-type transistors Mn1, Mn2, Mnc1, and Mnc2, and the resistors R5 and R6 are the same as these shown in FIG. 6, and, thus, the related description thereof is omitted.

As shown in FIG. 8, the drain of the P-type transistor M1 is coupled to a common-mode node cm3, the source of the P-type transistor M1 is coupled to the voltage source VS1, and the gate of the P-type transistor M1 receives the bias voltage Vbias2. The P-type transistor M1 serves as a current source. The drain of the P-type transistor M2 is coupled to the node n1, the source of the P-type transistor M2 is coupled to the common-mode node cm3, and the gate of the P-type transistor M2 is coupled to the node p3 to receive the comparison signal Vp3. The drain of the P-type transistor M3 is coupled to the node p1, the source of the P-type transistor M3 is coupled to the common-mode node cm3, and the gate of the P-type transistor M3 is coupled to the node n3 to receive the comparison signal Vn3.

Figure 9A:
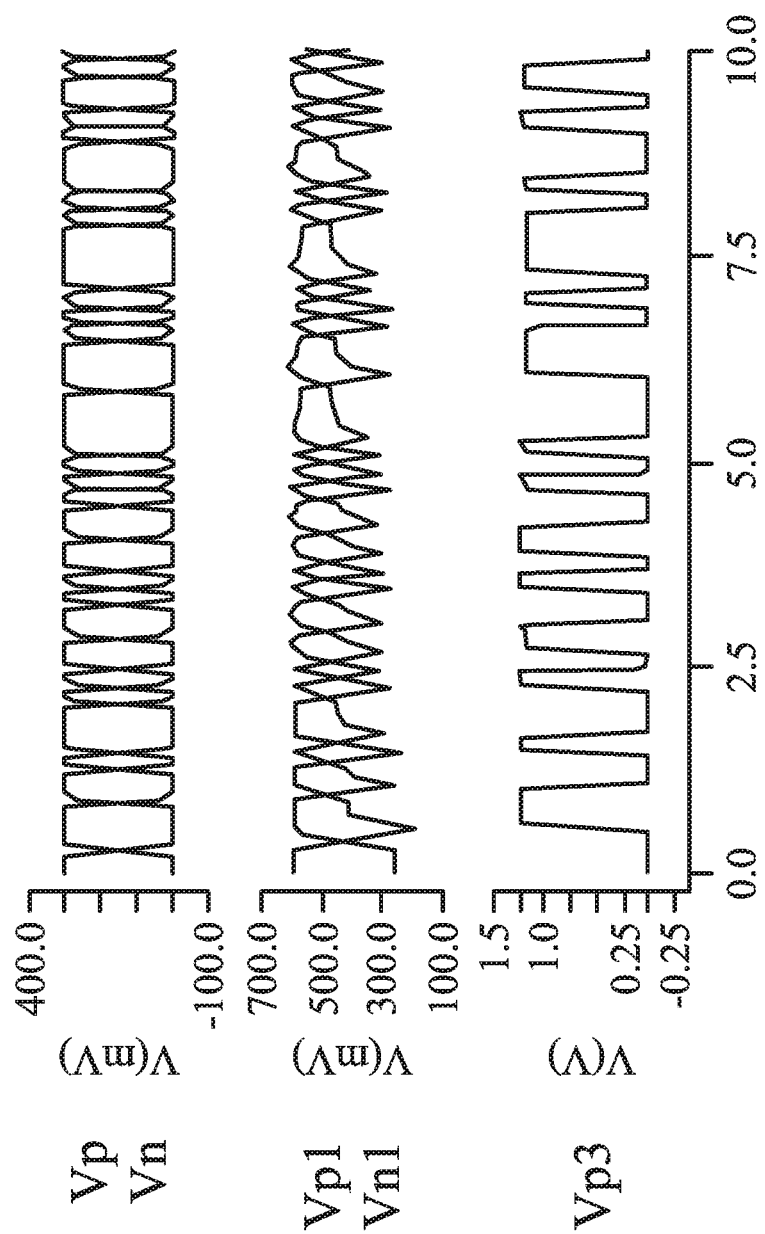
FIGS. 9A and 9B show timing charts of main signals of a differential comparator according to an exemplary embodiment.

According to the above configuration, the P-type transistors M2 and M3 are controlled by the comparison signals Vp3 and Vn3, respectively. Referring to FIG. 9A and FIG. 8, when the voltage signal Vp is at a high level and the voltage signal Vn is at a low level, the comparison signal Vp3 is at the level of the operation voltage VDD1 and the comparison signal Vn3 (not shown) has the level of the operation voltage VSS, thereby respectively turning off the P-type transistor M2 and turning on P-type transistor M3, herein the comparison signal Vn3 may be regarded as the inverted signal of the comparison signal Vp3. At this time, a current from the P-type transistor M1 acting as a current source flows through the P-type transistor M3, so that the comparison signal Vp1 on the node p1 is maintained approximately at the threshold voltage Vth of the P-type transistor. On the contrary, when the voltage signal Vp is at a low level and the voltage signal Vn is at a high level, the comparison signal Vn1 on the node n1 is maintained approximately at the threshold voltage Vth of the P-type transistor.

Figure 9B:
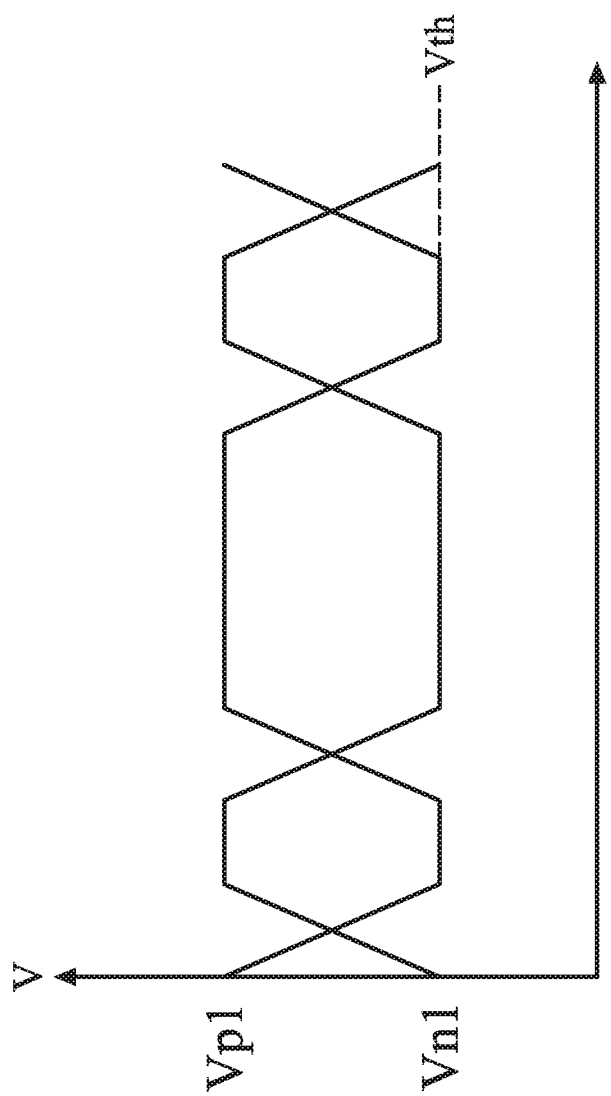

According to the above description, the lowest level of the comparison signals Vp1 and Vn1 is the threshold voltage Vth, as shown in FIG. 9B. Therefore, when the voltage signals Vp and Vn are inverted, the comparison signal Vp1/Vn1 may reach the steady state in a shorter time, so that the differential comparison circuit has a faster operation speed.

While the invention has been described by way of example and in terms of the preferred embodiments, it should be understood that the invention is not limited to the disclosed embodiments. On the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A serializer/deserializer system comprising:
    a plurality of channel circuits, wherein each channel circuit is coupled to a first clock line and a second clock line and generates a third differential signal;
    a phase-locked loop circuit, generating a first differential signal which comprises a first clock signal and a second clock signal;
    a first buffer, coupled to the phase-locked loop circuit, receiving the first clock signal and buffering the first clock signal;
    a second buffer, coupled to the phase-locked loop, receiving the second clock signal and buffering the second clock signal;
    a first capacitor, coupled to an output terminal of the first buffer to receive a buffered first clock signal and coupled to the first clock line to output a third clock signal; and
    a second capacitor, coupled to an output terminal of the second buffer to receive a buffered second clock signal and coupled to the second clock line to output a fourth clock signal,
    wherein a swing of a second differential signal comprising the third clock signal and the fourth clock signal is smaller than a swing of the first differential signal, and
    wherein a swing of the third differential signal is larger than the swing of the second differential signal.

2. The serializer/deserializer system as claimed in claim 1, wherein the first capacitor and the second capacitor are metal-oxide-metal capacitors.

3. The serializer/deserializer system as claimed in claim 2, wherein each of the plurality of channel circuits comprises a differential comparator, the differential comparator comprises:
- a first-stage comparison circuit, coupled to the first clock line and the second clock line to receive the third clock signal and the fourth clock signal, generating a first comparison signal and a second comparison signal according to the third clock signal and the fourth clock signal, wherein the first-stage comparison circuit comprises a first active inductor circuit;
- a second-stage comparison circuit, coupled to the first-stage comparison circuit, receiving the first comparison signal and the second comparison signal and generating a third comparison signal and a fourth comparison signal according to the first comparison signal and the second comparison signal; and
- an inverter circuit, coupled to the second-stage comparison circuit, receiving the third comparison signal and the fourth comparison signal and generating a first output voltage signal and a second output voltage signal according to the third comparison signal and the fourth comparison signal,
- wherein the third differential signal comprises the first output voltage signal and the second output voltage signal.

4. The serializer/deserializer system as claimed in claim 3, wherein the first comparison circuit comprises:
- a first first-type transistor comprising a first terminal coupled to a first node, a second terminal coupled to a first voltage source, and a control terminal coupled to a second node, wherein the first comparison signal is generated on the first node;
- a second first-type transistor comprising a first terminal and a second terminal both coupled to the first voltage source, and a control terminal coupled to the second node;
- a first resistor comprising one terminal coupled to the first node and the other terminal coupled to the second node;
- a third first-type transistor comprising a first terminal coupled to the first voltage source, a second terminal coupled to a third node, and a control terminal coupled to a fourth node, wherein the second comparison signal is generated on the third node;
- a fourth first-type transistor comprising a first terminal and a second terminal both coupled to the first voltage source, and a control terminal coupled to the fourth node;
- a second resistor comprising one terminal coupled to the third node and the other terminal coupled to the fourth node;
- a first second-type transistor comprising a first terminal coupled to the first node, a second terminal coupled to a first common-mode node, and a control terminal receiving the third clock signal;
- a second second-type transistor comprising a first terminal coupled to the third node, a second terminal coupled to the first common-mode node, and a control terminal receiving the fourth clock signal; and
- a third second-type transistor comprising a first terminal coupled to the first common-mode node, a second terminal coupled to a second voltage source, and a control terminal receiving a bias voltage;

wherein the first active inductor circuit comprises a first active inductor and a second active inductor,
wherein the first active inductor comprises the first first-type transistor, the second first-type transistor, and the first resistor, and
wherein the second active inductor comprises the third first-type transistor, the fourth first-type transistor, and the second resistor.

5. The serializer/deserializer system as claimed in claim 4, wherein the first, second, third, and fourth first-type transistors are P-type transistors, the first, second, and third second-type transistors are N-type transistors, a voltage provided by the first voltage source is an operation voltage for the plurality of channel circuits, and a voltage provided by the second voltage source is a ground voltage.

6. The serializer/deserializer system as claimed in claim 4, wherein the first, second, third, and fourth first-type transistors are N-type transistors, the first, second, and third second-type transistors are P-type transistors, a voltage provided by the first voltage source is a ground voltage, and a voltage provided by the second voltage source is an operation voltage for the plurality of channel circuits.

7. The serializer/deserializer system as claimed in claim 4, wherein the first-stage comparison circuit further comprises:
- a fifth first-type transistor comprising a first terminal coupled to the third node, a second terminal coupled to a second common-mode node, and a control terminal receiving the third comparison signal;
- a sixth first-type transistor comprising a first terminal coupled to the first node, a second terminal coupled to the second common-mode node, and a control terminal receiving the fourth comparison signal;
- a fourth second-type transistor comprising a first terminal coupled to the second voltage source, a second terminal coupled to the second common-mode node, and a control terminal receiving the bias voltage.

8. The serializer/deserializer system as claimed in claim 3, wherein the second-stage comparison circuit comprises a second active inductor circuit.

9. The serializer/deserializer system as claimed in claim 8, wherein the second-stage comparison circuit comprises:
- a first first-type transistor comprising a first terminal coupled to a first node, a second terminal coupled to a first voltage source, and a control terminal receiving the first comparison signal;
- a second first-type transistor comprising a first terminal coupled to a second node, a second terminal coupled to the first voltage source, and a control terminal receiving the first comparison signal, wherein the third comparison signal is generated on the second node;
- a third first-type transistor comprising a first terminal coupled to a third node, a second terminal coupled to the first voltage source, and a control terminal receiving the second comparison signal;
- a fourth first-type transistor comprising a first terminal coupled to a fourth node, a second terminal coupled to the first voltage source, and a control terminal receiving the second comparison signal, wherein the fourth comparison signal is generated on the fourth node;
- a first second-type transistor comprising a first terminal coupled to the first node, a second terminal coupled to a second voltage source, and a control terminal coupled to a fifth node;
- a second second-type transistor comprising a first terminal and second terminal both coupled to the second voltage source, and a control signal coupled to the fifth node;

a first resistor comprising one terminal coupled to the first node and the other terminal coupled to the fifth node;
a third second-type transistor comprising a first terminal coupled to the second node, a second terminal coupled to the second voltage source, and a control terminal coupled to the third node;
a fourth second-type transistor comprising a first terminal coupled to the third node, a second terminal coupled to the second voltage source, and a control terminal coupled to a sixth node;
a fifth second-type transistor comprising a first terminal and second terminal both coupled to the second voltage source, and a control signal coupled to the sixth node;
a second resistor comprising one terminal coupled to the third node and the other terminal coupled to the sixth node; and
a sixth second-type transistor comprising a first terminal coupled to the fourth node, a second terminal coupled to the second voltage source, and a control terminal coupled to the first node,
wherein the second active inductor circuit comprises a first active inductor and a second active inductor,
wherein the first active inductor comprises the first second-type transistor, the second second-type transistor, and the first resistor,
wherein the second active inductor comprises the fourth second-type transistor, the fifth second-type transistor, and the second resistor.

10. The serializer/deserializer system as claimed in claim 9, wherein the first, second, third, and fourth first-type transistors are P-type transistors, the first, second, third, fourth, fifth, and sixth second-type transistors are N-type transistors, a voltage provided by the first voltage source is an operation voltage for the plurality of channel circuits, and a voltage provided by the second voltage source is a ground voltage.

11. The serializer/deserializer system as claimed in claim 9, wherein the first, second, third, and fourth first-type transistors are N-type transistors, the first, second, third, fourth, fifth, and sixth second-type transistors are P-type transistors, a voltage provided by the first voltage source is a ground voltage, and a voltage provided by the second voltage source is an operation voltage for the plurality of channel circuits.

12. A differential comparator for a serializer/deserializer system, comprising:
a first-stage comparison circuit comprising a first active inductor circuit receiving a first differential signal comprising a first input voltage signal and a second input voltage signal respectively from a first clock line and a second clock line, and generating a first comparison signal and a second comparison signal according to the first input voltage signal and the second input voltage signal;
a second-stage comparison circuit, coupled to the first-stage comparison circuit, receiving the first comparison signal and the second comparison signal and generating a third comparison signal and a fourth comparison signal according to the first comparison signal and the second comparison signal; and
an inverter circuit, coupled to the second-stage comparison circuit, receiving the third comparison signal and the fourth comparison signal and generating a second differential signal comprising a first output voltage signal and a second output voltage signal according to the third comparison signal and the fourth comparison signal,
wherein a swing of the second differential signal is larger than a swing of the first differential signal.

13. The differential comparator as claimed in claim 12, wherein the first comparison circuit comprises:
a first first-type transistor comprising a first terminal coupled to a first node, a second terminal coupled to a first voltage source, and a control terminal coupled to a second node, wherein the first comparison signal is generated on the first node;
a second first-type transistor comprising a first terminal and a second terminal both coupled to the first voltage source, and a control terminal coupled to the second node;
a first resistor comprising one terminal coupled to the first node and the other terminal coupled to the second node;
a third first-type transistor comprising a first terminal coupled to the first voltage source, a second terminal coupled to a third node, and a control terminal coupled to a fourth node, wherein the second comparison signal is generated on the third node;
a fourth first-type transistor comprising a first terminal and a second terminal both coupled to the first voltage source, and a control terminal coupled to the fourth node;
a second resistor comprising one terminal coupled to the third node and the other terminal coupled to the fourth node;
a first second-type transistor comprising a first terminal coupled to the first node, a second terminal coupled to a first common-mode node, a control terminal receiving the first input voltage signal;
a second second-type transistor comprising a first terminal coupled to the third node, a second terminal coupled to the first common-mode node, a control terminal receiving the second input voltage signal; and
a third second-type transistor comprising a first terminal coupled to the first common-mode node, a second terminal coupled to a second voltage source, and a control terminal receiving a bias voltage;
wherein the first active inductor circuit comprises a first active inductor and a second active inductor,
wherein the first active inductor comprises the first first-type transistor, the second first-type transistor, and the first resistor,
wherein the second active inductor comprises the second first-type transistor, the fourth first-type transistor, and the second resistor.

14. The differential comparator as claimed in claim 13, wherein the first, second, third, and fourth first-type transistors are P-type transistors, the first, second, and third second-type transistors are N-type transistors, a voltage provided by the first voltage source is an operation voltage for the plurality of channel circuits, and a voltage provided by the second voltage source is a ground voltage.

15. The differential comparator as claimed in claim 13, wherein the first, second, third, and fourth first-type transistors are N-type transistors; the first, second, and third second-type transistors are P-type transistors, a voltage provided by the first voltage source is a ground voltage, and a voltage provided by the second voltage source is an operation voltage for the plurality of channel circuits.

16. The differential comparator as claimed in claim 13, wherein the first-stage comparison circuit further comprises:
a fifth first-type transistor comprising a first terminal coupled to the third node, a second terminal coupled to a second common-mode node, and a control terminal receiving the third comparison signal;

a sixth first-type transistor comprising a first terminal coupled to the first node, a second terminal coupled to the second common-mode node, and a control terminal receiving the fourth comparison signal;

a fourth second-type transistor comprising a first terminal coupled to the second voltage source, a second terminal coupled to the second common-mode node, and a control terminal receiving the bias voltage.

17. The differential comparator as claimed in claim 12, wherein the second-stage comparison circuit comprises a second active inductor circuit.

18. The differential comparator as claimed in claim 17, wherein the second-stage comparison circuit comprises:
- a first first-type transistor comprising a first terminal coupled to a first node, a second terminal coupled to a first voltage source, and a control terminal receiving the first comparison signal;
- a second first-type transistor comprising a first terminal coupled to a second node, a second terminal coupled to the first voltage source, and a control terminal receiving the first comparison signal, wherein the third comparison signal is generated on the second node;
- a third first-type transistor comprising a first terminal coupled to a third node, a second terminal coupled to the first voltage source, and a control terminal receiving the second comparison signal;
- a fourth first-type transistor comprising a first terminal coupled to a fourth node, a second terminal coupled to the first voltage source, and a control terminal receiving the second comparison signal, wherein the fourth comparison signal is generated on the fourth node;
- a first second-type transistor comprising a first terminal coupled to the first node, a second terminal coupled to a second voltage source, and a control terminal coupled to a fifth node;
- a second second-type transistor comprising a first terminal and second terminal both coupled to the second voltage source, and a control terminal coupled to the fifth node;
- a first resistor comprising one terminal coupled to the first node and the other terminal coupled to the fifth node;
- a third second-type transistor comprising a first terminal coupled to the second node, a second terminal coupled to the second voltage source, and a control terminal coupled to the third node;
- a fourth second-type transistor comprising a first terminal coupled to the third node, a second terminal coupled to the second voltage source, and a control terminal coupled to a sixth node;
- a fifth second-type transistor comprising a first terminal and second terminal both coupled to the second voltage source, and a control terminal coupled to the sixth node;
- a second resistor comprising one terminal coupled to the third node and the other terminal coupled to the sixth node; and
- a sixth second-type transistor comprising a first terminal coupled to the fourth node, a second terminal coupled to the second voltage source, and a control terminal coupled to the first node, wherein the second active inductor circuit comprises a first active inductor and a second active inductor, wherein the first active inductor comprises the first second-type transistor, the second second-type transistor, and the first resistor, and wherein the second active inductor comprises the fourth second-type transistor, the fifth second-type transistor, and the second resistor.

19. The differential comparator as claimed in claim 18, wherein the first, second, third, and fourth first-type transistors are P-type transistors, the first, second, third, fourth, fifth, and sixth second-type transistors are N-type transistors, a voltage provided by the first voltage source is an operation voltage for the plurality of channel circuits, and a voltage provided by the second voltage source is a ground voltage.

20. The differential comparator as claimed in claim 18, wherein the first, second, third, and fourth first-type transistors are N-type transistors, the first, second, third, fourth, fifth, and sixth second-type transistors are P-type transistors, a voltage provided by the first voltage source is a ground voltage, and a voltage provided by the second voltage source is an operation voltage for the plurality of channel circuits.

* * * * *